US005556796A

United States Patent [19]
Garnett et al.

[11] Patent Number: 5,556,796
[45] Date of Patent: Sep. 17, 1996

[54] SELF-ALIGNMENT TECHNIQUE FOR FORMING JUNCTION ISOLATION AND WELLS

[75] Inventors: Martin E. Garnett, Los Gatos; Michael R. Hsing, San Jose, both of Calif.

[73] Assignee: Micrel, Inc., San Jose, Calif.

[21] Appl. No.: 428,929

[22] Filed: Apr. 25, 1995

[51] Int. Cl.$^6$ .................................................. H01L 21/265
[52] U.S. Cl. .................. 437/31; 437/27; 437/59; 437/69; 437/75; 437/148; 437/984; 148/DIG. 9; 257/370
[58] Field of Search ...................... 437/75, 31, 74, 437/59, 69, 27, 148, 984; 148/DIG. 9; 257/350, 370

[56] References Cited

U.S. PATENT DOCUMENTS

| | | | |
|---|---|---|---|
| 4,466,171 | 8/1984 | Jochems | 29/571 |
| 4,497,106 | 2/1985 | Momma et al. | 29/571 |
| 4,504,766 | 3/1985 | Naguno et al. | 148/175 |
| 4,535,529 | 8/1985 | Jochems | 257/370 |
| 4,724,221 | 2/1988 | Jochems | 437/74 |
| 4,734,382 | 3/1988 | Krishna | 257/370 |
| 5,254,486 | 10/1993 | Alter | 437/31 |

FOREIGN PATENT DOCUMENTS

| | | | |
|---|---|---|---|
| 0004339 | 1/1987 | Japan | 437/74 |
| 0105557 | 4/1989 | Japan | 437/74 |

*Primary Examiner*—George Fourson
*Assistant Examiner*—Long Pham
*Attorney, Agent, or Firm*—Skjerven, Morrill, MacPherson, Franklin & Friel; William L. Paradice, III

[57] ABSTRACT

A method in accordance with one embodiment of the present invention may be used to self-align isolation regions, sinkers, and wells. In this improved method, P+ isolation regions, N+ sinkers, and P-wells are defined using the same masking step used to define the N-wells. The use of a single masking step to initially define the P+ isolation regions, N+ sinkers, N-wells, and P-wells results in the self-alignment of these regions. Several critical mask alignments are thereby eliminated, thus avoiding/simplifying fabrication steps, conserving die area, and allowing increased component density.

17 Claims, 3 Drawing Sheets

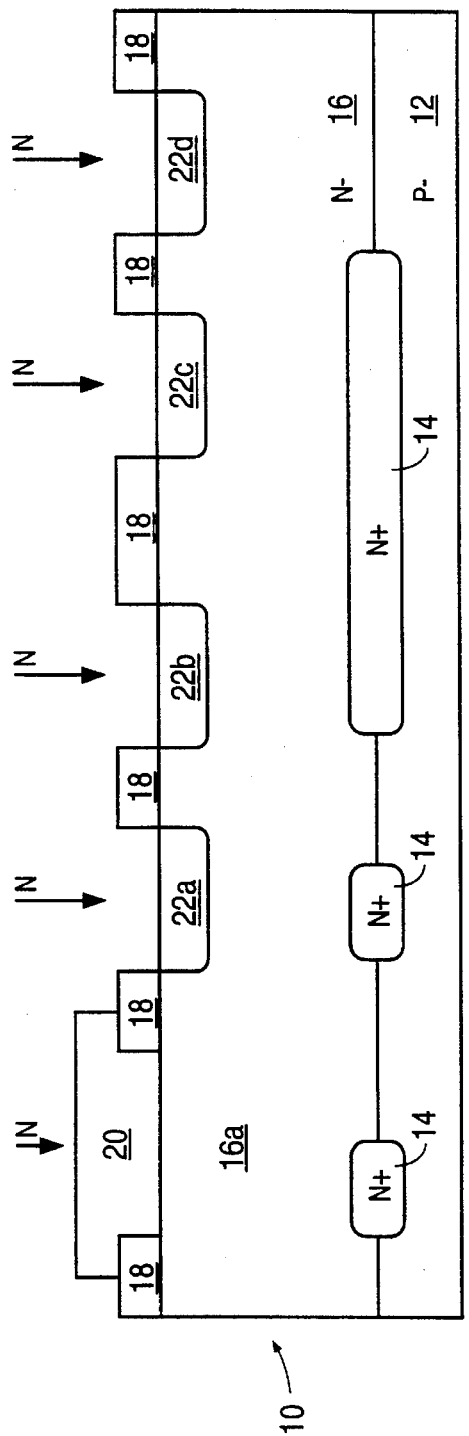
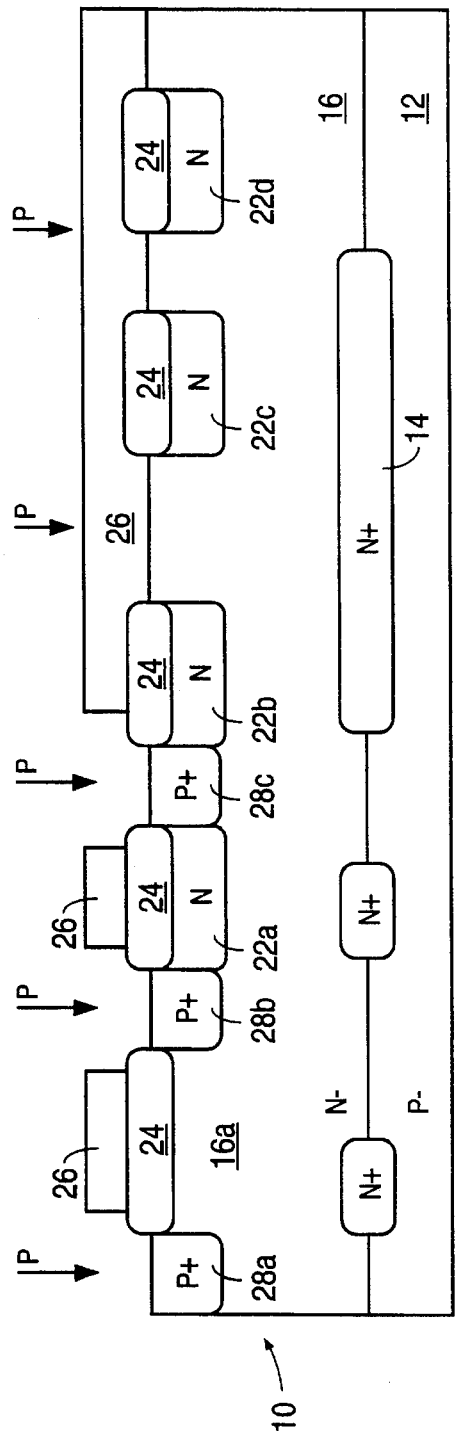
FIG. 1
FIG. 2

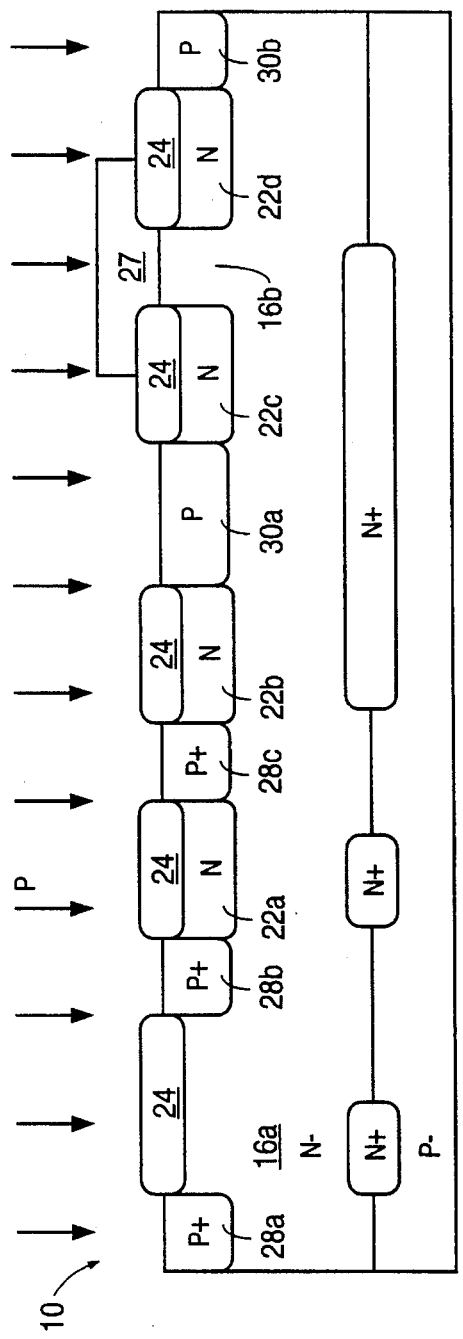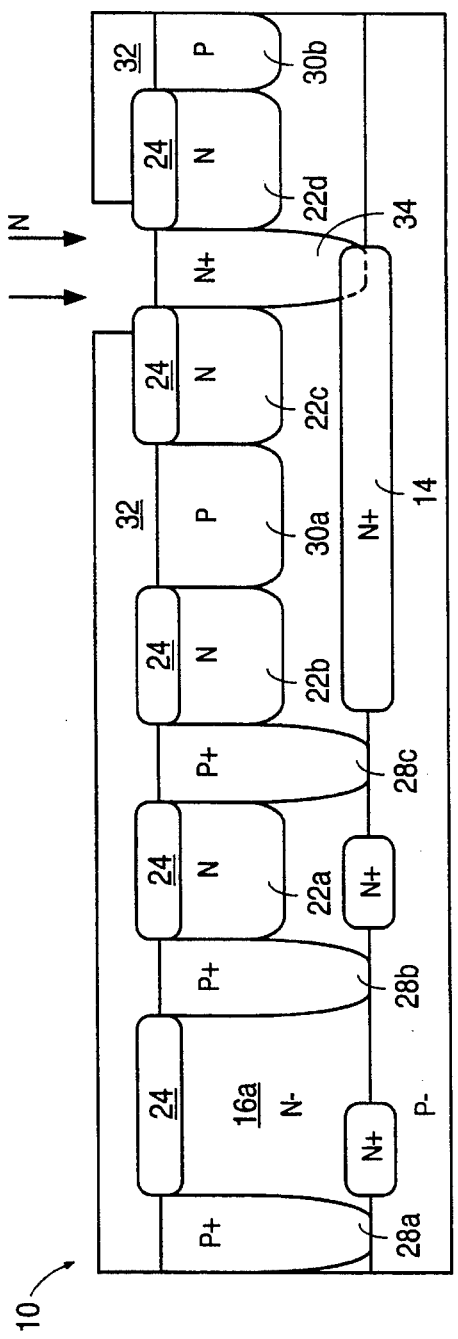

5,556,796

SELF-ALIGNMENT TECHNIQUE FOR FORMING JUNCTION ISOLATION AND WELLS

CROSS REFERENCE TO RELATED APPLICATION

This application is related to commonly owned U.S. patent application Ser. No. 08/411,368 entitled "SELF-ALIGNMENT TECHNIQUE FOR SEMICONDUCTOR DEVICES" filed on Mar. 27, 1995, and attorney docket number M-3124 US.

FIELD OF THE INVENTION

This invention relates to a method for producing transistor structures using one or more wells in conjunction with isolation regions or sinkers.

BACKGROUND OF THE INVENTION

In the semiconductor industry there is a continuing desire for smaller integrated circuits which can be fabricated at lower costs. Thus, any process which forms integrated circuits using less die area while achieving savings in manufacturing costs is very valuable.

It is also desirable to fabricate a semiconductor structure containing both bipolar and CMOS devices. In a conventional process used in the fabrication of such a BiCMOS semiconductor structure, a P-type substrate has formed thereon an N+ buried layer and an N− epitaxial layer. A first masking and doping step is used to form P+ isolation regions (which generally electrically isolate adjacent devices) contacting the substrate. A second masking and doping step is used to form N+ sinkers (which may serve as, for example, a low-resistance collector contact) contacting a portion of the N+ buried layer. After the N+ sinkers and P+ isolation regions are driven-in, additional masking and doping steps are used to define N-wells and P-wells. Subsequent masking and doping steps may then be used to form the source/drain regions of MOS transistors and/or the collector, base, and emitter regions of bipolar transistors in the various wells and epitaxial tubs formed.

The fabrication of the above-described structure requires careful alignments of the various masks used to form the N+ sinkers, isolation regions, and the wells. Each masking step requires an alignment tolerance that must be factored into the lateral dimensions of the semiconductor structure. These alignment tolerances, which may be on the order of 1–2 μm, are necessary to compensate for alignment errors. Accordingly, as the number of masking layers which require careful alignment increases, the required alignment tolerances undesirably cause the lateral dimensions of the device to also increase and thereby result in a wasting of valuable silicon real estate.

SUMMARY

An improved method for fabricating a semiconductor structure which may contain, for instance, bipolar and MOS devices is disclosed which overcomes problems in the art discussed above.

A method in accordance with one embodiment of the present invention may be used to self align isolation regions, sinkers, and wells. In this improved method, P+ isolation regions, N+ sinkers, and P-wells are defined using the same masking step used to define the N-wells. The use of a single masking step to initially define the P+ isolation regions, N+ sinkers, N-wells, and P-wells results in the self-alignment of these regions. Several critical mask alignments are thereby eliminated, thus avoiding/simplifying fabrication steps, conserving die area, and allowing increased component density.

In one embodiment of this improved method, a P-type substrate has formed thereon an N+ buried layer and an N− epitaxial layer. A nitride masking layer is then deposited over the epitaxial layer and selectively etched to form a pattern. The exposed portions of the epitaxial layer define where N-wells will be formed, while the remaining portions of nitride overlie where self-aligned P+ isolation regions, N+ sinkers, and P-wells will be formed. An optional resist masking layer may be formed over the nitride masking layer to preserve, i.e., leave unexposed, regions of the N− epitaxial layer (N− tubs) which may be used for the implementation of high voltage CMOS, DMOS, or biploar devices.

N-type dopants are then implanted into the exposed portions of the epitaxial layer to form the N-wells. A layer of oxide is then grown over the exposed portions of the epitaxial layer (i.e., over the N-wells and N− tubs, if any) so as to mask the N-wells (and N− tubs) during subsequent doping steps.

The nitride portions are then removed to expose underlying regions of the epitaxial layer in which the N+ sinkers, P+ isolation regions, deep P+ regions, and P-wells will be formed in subsequent masking, etching, and doping steps. The subsequent mask alignments for doping these regions are no longer critical since the oxide grown over the N-wells serves as a mask to self-align the subsequently formed regions to the N-wells.

BRIEF DESCRIPTION OF THE DRAWINGS

FIGS. 1–4 are cross-sectional views of a semiconductor structure illustrating various steps in the fabrication of a semiconductor structure in accordance with the present invention.

DETAILED DESCRIPTION OF THE PREFERRED EMBODIMENTS

Figure 5:
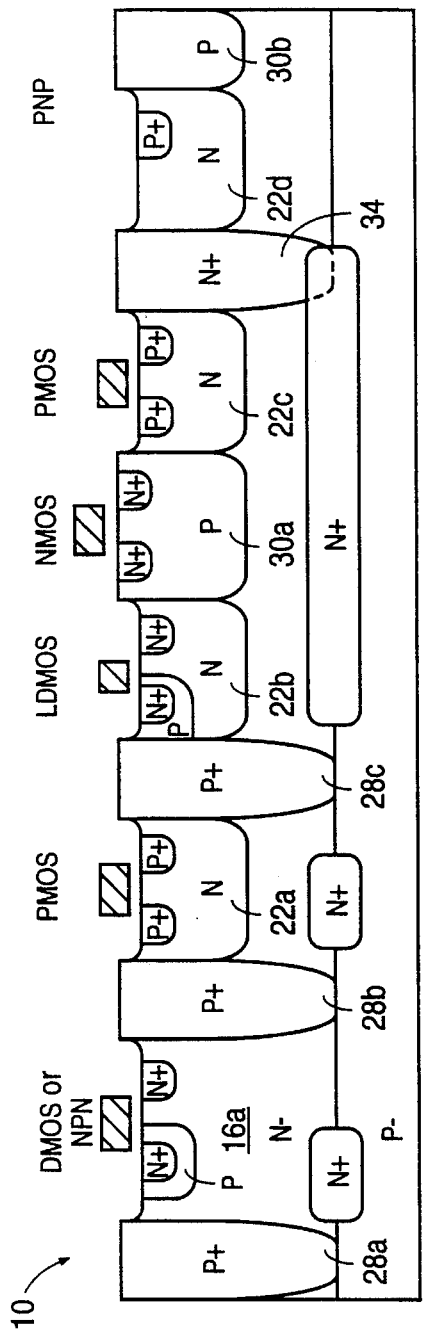
FIGS. 5 and 6 are cross-sectional views of the semiconductor structure illustrating some examples of MOS and bipolar transistors utilizing the structure of FIG. 4.

This method will be described below in the context of the fabrication of a particular semiconductor structure 10 capable of containing bipolar and MOS devices, although other embodiments will become apparent to those skilled in the art after reading this disclosure.

Structure 10 includes a P-type substrate 12 having formed thereon an N+ buried layer 14 and an N− epitaxial layer 16, as shown in FIG. 1. N+ buried layer 14 may be formed using an Antimony or Arsenic implant. N-type epitaxial layer 16 may, for instance, be of a thickness between 6 to 9 μm and of a resistivity of approximately 3 Ω-cm (a dopant concentration of about 1.5 E15/cm$^3$). The resistivity and thickness will depend upon the desired characteristics of the devices to be formed in the epitaxial layer 16. The conductivity types described with respect to structure 10 may also be reversed while still realizing the benefits of the invention.

A nitride ($Si_3N_4$) layer 18 is deposited over the top surface of epitaxial layer 16 and then selectively etched using conventional methods to form the pattern shown in FIG. 1. This is a non-critical mask alignment step. This pattern not only defines the N-wells but also allows the self-alignment of subsequently formed P-wells, P+ isolation regions, and N+ sinkers. The particular pattern used would, of course, depend on the components desired to be formed.

A thin pad oxide (not shown) may be grown on the surface of epitaxial layer 16 prior to nitride layer 18 being deposited to simplify etching of the nitride and to protect the epitaxial layer 16 from impurities in the nitride.

An optional, non-critical, masking step to form masking layer 20 may then be performed to mask a portion 16a of epitaxial layer 16 for use as a lightly doped N-tub suitable for containing, for example, a bipolar transistor. Masking layer 20, which may be a photoresist or other suitable masking material, is formed to prevent dopants from being deposited into portion 16a during a subsequent doping step.

Using masking layer 20 and the remaining portions of nitride layer 18 as a mask, N-type dopants such as Phosphorus ions are implanted at an energy of 60 keV and a dosage of 2.2 E12 ions/cm$^2$ into epitaxial layer 16 to form N-wells 22a through 22d. Drive-in may be performed during subsequent heating steps. Masking layer 20 is then removed by a suitable etchant.

A layer of oxide 24 approximately 4000 Å thick is then grown over the exposed epitaxial layer 16 portions. The nitride layer 18 portions only allow oxide 24 to grow over N-wells 22a–22d and over N-tub portion 16a. This step may be conducted by placing the wafer in an oxygen atmosphere and using conventional oxide growing techniques. The remaining portions of nitride layer 18 are then removed with a suitable nitride etch, such as H$_3$PO$_4$, thereby leaving exposed those regions in which P+ isolation regions, N+ sinkers, and P-wells will later be formed.

P+ isolation regions are formed by first forming an oversized masking layer 26 (such as a photoresist), using conventional photolithographic methods, to expose only those portions of epitaxial layer 16 in which P+ isolation regions are to be formed. This is a non-critical mask alignment step. P-type dopants such as Boron are implanted at an energy of 35 keV and a dosage of 4.5 E15 ions/cm$^2$ into epitaxial layer 16, using as a mask the masking layer 26 and oxide 24. These dopants will subsequently be driven-in to form P+ isolation regions 28a–28c (see also FIG. 4) which are self-aligned with N-wells 22a and 22b and N-tub portion 16a due to oxide 24.

Oversized masking layer 26 is removed. Another oversized masking layer 27 is then formed and selectively etched, as shown in FIG. 3, to mask that portion of epitaxial layer 16 where an N+ sinker is to be subsequently formed. This is a non-critical mask alignment step. P-type dopants such as Boron are implanted at an energy of 35 keV and a dosage of 8.0 E12 ions/cm$^2$ to further dope P+ isolation regions 28a–28c while simultaneously forming P-wells 30a and 30b. P-wells 30a and 30b are automatically self-aligned with N-wells 22b, 22c, and 22d. The previously formed oxide 24 acts as a mask to ensure that the implanted P-type ions do not counter-dope N-wells 22a–22d and N-tub portion 16a, while masking layer 27 prevents dopants from being deposited in a portion 16b of epitaxial layer 16. The masking layer 27 of FIG. 3 is then removed using any suitable means.

In another embodiment of the present invention, an additional masking and etching step is eliminated. In this embodiment, masking layer 26 is removed immediately after P+ isolation regions are formed. P-type dopants such as Boron are implanted at an energy of 35 keV and a dosage of 8.0 E12 ions/cm$^2$ to further dope P+ isolation regions 28a–c while simultaneously forming P-wells 30a and 30b, as discussed above. Note that although the exposed portions of N− epitaxial layer 16 which in later steps will become N+ sinker regions have been doped with P-type dopants, the subsequent dosage of N-type dopants which forms the N+ sinkers is approximately 500 times the dosage of the previous P-type dopant implant. Accordingly, the effect of the P-type dopant implant into N+ sinker regions is insignificant.

A masking layer 32 of photoresist or other suitable masking material is spun-on, or otherwise deposited on, the top surface of structure 10 and selectively etched, as shown in FIG. 4, to expose portions of epitaxial layer 16 in which an N+ sinker is to be formed. This is a non-critical mask alignment step. N-type dopants such as Phosphorus are implanted at an energy of 80 keV and a dosage of 4.5 E15 ions/cm$^2$ into portion 16b of epitaxial layer 16 to form an N+ sinker 34 (shown after drive-in). N+ sinker 34 is self-aligned with N-wells 22c and 22d. Masking layer 32 is then removed using any suitable means.

In a single process step, N-wells 22a–22d, P+ isolation regions 28a–28c, P-wells 30a–30b, and N+ sinker 34 are then simultaneously driven-in such that P+ isolation regions 28a–28c contact P− substrate 12 and N+ sinker 34 contacts N+ buried layer 14. P+ isolation regions 28b–28c and P-wells 30a–30b prevent any lateral diffusion of N-well regions 22a–22d during drive-in.

It is to be understood that the particular order in which P+ isolation regions 28a–c, N+ sinker 34, N-wells 22a–d, and P-wells 30a–b are formed may be varied while still realizing the benefits of the present invention.

If a deep P+ region for a DMOS transistor is required, an oversized mask is then formed and a blanket implant conducted.

Oxide 24 is then stripped off. In one embodiment, an HF solution is used as an etchant.

It is to be understood that P+ isolation regions 28a–28c, P-wells 30a–30b, and N+ sinker 34 may be formed in any suitable order without departing from the scope of the present invention. Further, additional drive-in steps may be added in order to adjust the desired diffusion depths of N-wells 22a–22d, P+ isolation regions 28a–28c, P-wells 30a–30b, and N+ sinker 34.

Figure 6:
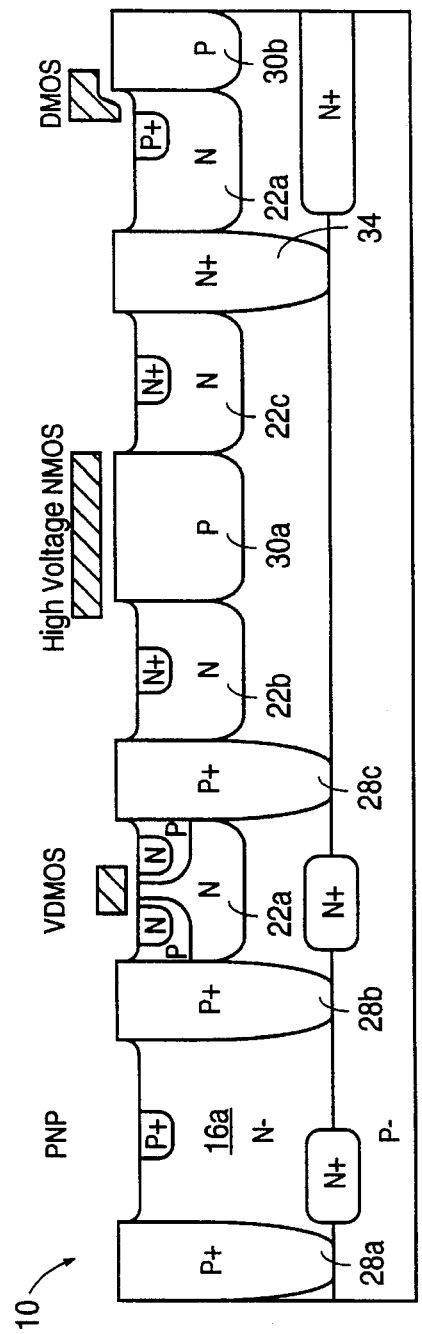

Conventional processing techniques are now used to form active regions in the various N-wells, P-wells, and tubs. FIGS. 5 and 6 illustrate various bipolar and MOS transistor structures which may utilize the structure of FIG. 4. Polysilicon gates are illustrated in FIGS. 5 and 6 isolated from the epitaxial layer 16 with a gate oxide.

This improved self-alignment method may be used in the fabrication of many other devices. For instance, using the present invention, deep P+ body contact regions, or any other P or N region, may be self-aligned with the N-wells.

Although in the preferred embodiment described above, the N+ sinker is formed after the N-wells, P+ isolation regions and P-wells are formed, the N+ sinker may be formed, for instance, after the N-wells are formed and before the P+ isolation regions are formed.

The formation of structure 10 using the improved method as described above requires no critical masking steps, and all the regions shown in FIG. 4 are essentially self-aligned with one another using oxide 24 as a partial mask. This automatic self-alignment thus eliminates the need to accommodate alignment tolerances and thus conserves die area. As the complexity of an integrated circuit structure increases, the savings in die area become more significant. Other advantages include simpler fabrication steps, more predictable device performance, and higher yield (by avoiding misalignment of masks).

The conductivity types of the various regions, substrate, and epitaxial layer may be reversed while still achieving the benefits of this invention. For example, instead of N-wells 22 being formed in N− epitaxial layer 16 in FIG. 1, P-wells may instead be formed, and subsequent regions formed self-aligned with the P-wells. In certain applications, the epitaxial layer and buried layer may not be required and thus may be eliminated.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a semiconductor structure comprising the steps of:
   (1) forming a patterned nitride layer overlying a semiconductor material of a first conductivity type to expose first portions of said semiconductor material;
   (2) depositing dopants of said first conductivity type into said first portions as defined by said nitride layer to form first doped regions in said semiconductor material;
   (3) growing a layer of oxide over said first doped regions;
   (4) removing said nitride layer, but not removing said oxide, to expose second portions of said semiconductor material previously underlying said nitride layer;
   (5) forming a first masking layer to selectively mask one or more of said second portions from dopants in a subsequent doping step; and
   (6) depositing dopants of second conductivity type into said second regions not masked by said first masking layer to form second doped regions, said oxide masking said first doped portions from dopants during this step, said second doped regions being self-aligned with said first doped regions, wherein said first doped regions are N-wells and said second doped regions are P-type regions.

2. A method for forming a semiconductor structure comprising the steps of:
   (1) forming a patterned nitride layer overlying a semiconductor material of a first conductivity type to expose first portions of said semiconductor material;
   (2) depositing dopants of either said first conductivity type or a second conductivity type into said first portions as defined by said nitride layer to form first doped regions in said semiconductor material;
   (3) growing a layer of oxide over said first doped regions;
   (4) removing said nitride layer, but not removing said oxide, to expose second portions of said semiconductor material previously underlying said nitride layer;
   (5) forming a first masking layer to selectively mask one or more of said second portions from dopants in a subsequent doping step; and
   (6) depositing dopants of either said first conductivity type or said second conductivity type into said second regions not masked by said first masking layer to form second doped regions, said oxide masking said first doped portions from dopants during this step, said second doped regions being self-aligned with said first doped regions, wherein said semiconductor-material is an epitaxial layer of said first conductivity type formed over a substrate of said second conductivity type, wherein said first doped regions are well regions of said first conductivity type, and wherein said second doped regions are isolation regions of said second conductivity type extending from a surface of said epitaxial layer to said substrate.

3. A method for forming a semiconductor structure comprising the steps of:
   (1) forming a patterned nitride layer overlying a semiconductor material of a first conductivity type to expose first portions of said semiconductor material;
   (2) depositing dopants of either said first conductivity type or a second conductivity type into said first portions as defined by said nitride layer to form first doped regions in said semiconductor material;
   (3) growing a layer of oxide over said first doped regions;
   (4) removing said nitride layer, but not removing said oxide, to expose second portions of said semiconductor material previously underlying said nitride layer;
   (5) forming a first masking layer to selectively mask one or more of said second portions from dopants in a subsequent doping step;
   (6) depositing dopants of either said first conductivity type or said second conductivity type into said second regions not masked by said first masking layer to form second doped regions, said oxide masking said first doped portions from dopants during this step, said second doped regions being self-aligned with said first doped regions;
   (7) forming a second masking layer after step 1 and before step 2 to mask a third portion of said semiconductor material from dopants deposited in step 2; and
   (8) removing said second masking layer prior to step 3 so that said layer of oxide is grown over said third portion, said third portion acting as a tub for a subsequently formed active device.

4. The method of claim 2 further comprising the steps of:
   removing said first masking layer after performing step 6, but not removing said oxide; and
   depositing dopants of the second conductivity type to form well regions self-aligned with said first doped regions.

5. The method of claim 3 wherein dopants of said first conductivity type are deposited in step 2.

6. The method of claim 3 wherein dopants of said second conductivity type are deposited in step 6.

7. The method of claim 3 wherein dopants of said second conductivity type are deposited in step 2.

8. The method of claim 3 wherein dopants of said first conductivity type are deposited in step 6.

9. The method of claim 1 wherein said first doped regions are N-wells and said second doped regions are P-wells self-aligned with said N-wells.

10. The method of claim 1 wherein said first doped regions are N-wells and said second doped regions are P+ isolation regions.

11. A method for forming a semiconductor structure comprising the steps of:
   (1) forming a patterned nitride layer overlying a semiconductor material of a first conductivity type to expose first portions of said semiconductor material;
   (2) depositing dopants of either said first conductivity type or a second conductivity type into said first portions as defined by said nitride layer to form first doped regions in said semiconductor material;

(3) growing a layer of oxide over said first doped regions;

(4) removing said nitride layer, but not removing said oxide, to expose second portions of said semiconductor material previously underlying said nitride layer;

(5) forming a first masking layer to selectively mask one or more of said second portions from dopants in a subsequent doping step;

(6) depositing dopants of either said first conductivity type or said second conductivity type into said second regions not masked by said first masking layer to form second doped regions, said oxide masking said first doped portions from dopants during this step, said second doped regions being self-aligned with said first doped regions, wherein said semiconductor material is an epitaxial layer of said first conductivity type formed over a substrate of said second conductivity type;

(7) forming a buried layer of said first conductivity type between said epitaxial layer and said substrate;

(8) forming a second masking layer, after step 6, to selectively mask said first doped portions and said second doped portions from dopants in a subsequent doping step; and (9) depositing dopants of said second conductivity type into exposed regions of said epitaxial layer not masked by said second masking layer and said oxide to form a sinker region of said second conductivity type extending from a top surface of said epitaxial layer to contact said buried layer of said second conductivity type, said oxide causing said sinker region to be self-aligned with one or more of said first doped regions.

12. A method for forming a semiconductor structure comprising the steps of:

(1) forming a patterned nitride layer overlying a semiconductor material of a first conductivity type to expose first portions of said semiconductor material;

(2) depositing dopants of either said first conductivity type or a second conductivity type into said first portions as defined by said nitride layer to form first doped regions in said semiconductor material;

(3) growing a layer of oxide over said first doped regions;

(4) removing said nitride layer, but not removing said oxide, to expose second portions of said semiconductor material previously underlying said nitride layer;

(5) forming a first masking layer to selectively mask one or more of said second portions from dopants in a subsequent doping step;

(6) depositing dopants of either said first conductivity type or said second conductivity type into said second regions not masked by said first masking layer to form second doped regions, said oxide masking said first doped portions from dopants during this step, said second doped regions being self-aligned with said first doped regions; and (7) forming a transistor within at least one of said first doped regions.

13. The method of claim 12 wherein said transistor is an MOS transistor.

14. The method of claim 12 wherein said transistor is a bipolar transistor.

15. The method of claim 12 further comprising the step of forming a transistor within at least one of said second doped regions.

16. The method of claim 15 wherein said transistor formed in said at least one of said second doped regions is an MOS transistor.

17. The method of claim 15 wherein said transistor formed in said at least one of said second doped regions is a bipolar transistor.

* * * * *